(12) United States Patent
Nakatani

(10) Patent No.: US 8,186,030 B2
(45) Date of Patent: May 29, 2012

(54) METHOD FOR MANUFACTURING ELASTIC WAVE DEVICE

(75) Inventor: Tadashi Nakatani, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 221 days.

(21) Appl. No.: 12/537,962

(22) Filed: Aug. 7, 2009

(65) Prior Publication Data
US 2010/0033055 A1    Feb. 11, 2010

(30) Foreign Application Priority Data
Aug. 11, 2008   (JP) ................. 2008-207309

(51) Int. Cl.
*H01L 41/22*    (2006.01)
*H01L 41/00*    (2006.01)
*H04R 17/00*    (2006.01)
*H05K 3/02*     (2006.01)
*H05K 3/10*     (2006.01)
*H02N 2/00*     (2006.01)

(52) U.S. Cl. ............... 29/25.35; 29/846; 310/346

(58) Field of Classification Search ............... 29/25.35, 29/825, 846; 310/346, 313, 313 R, 328, 310/363–366; 216/13
See application file for complete search history.

(56) References Cited

U.S. PATENT DOCUMENTS

| | | | |
|---|---|---|---|
| 5,873,154 A * | 2/1999 | Ylilammi et al. | 29/25.35 |
| 5,910,756 A * | 6/1999 | Ella | 333/133 |
| 6,021,552 A * | 2/2000 | Kishima et al. | 29/25.35 |
| 6,307,447 B1 * | 10/2001 | Barber et al. | 333/189 |
| 6,339,276 B1 * | 1/2002 | Barber et al. | 310/312 |
| 6,407,649 B1 * | 6/2002 | Tikka et al. | 333/133 |
| 6,476,536 B1 * | 11/2002 | Pensala | 310/312 |
| 6,787,048 B2 * | 9/2004 | Bradley et al. | 216/13 |
| 6,842,088 B2 * | 1/2005 | Yamada et al. | 333/187 |
| 6,909,340 B2 * | 6/2005 | Aigner et al. | 333/189 |
| 6,911,708 B2 * | 6/2005 | Park | 257/416 |
| 7,187,253 B2 * | 3/2007 | Sano et al. | 333/187 |
| 7,227,429 B2 * | 6/2007 | Kawachi et al. | 333/133 |
| 7,230,365 B2 * | 6/2007 | Nishiyama et al. | 310/313 A |
| 7,268,647 B2 * | 9/2007 | Sano et al. | 333/187 |
| 7,411,334 B2 * | 8/2008 | Nishiyama et al. | 310/313 R |
| 7,418,772 B2 * | 9/2008 | Nishiyama et al. | 29/25.35 |
| 7,564,174 B2 * | 7/2009 | Matsuda et al. | 310/346 |
| 2004/0026362 A1 * | 2/2004 | Nakatani | 216/13 |

(Continued)

FOREIGN PATENT DOCUMENTS

EP    1391988    2/2004

(Continued)

*Primary Examiner* — David Angwin
(74) *Attorney, Agent, or Firm* — Chen Yoshimura LLP

(57) ABSTRACT

A method for manufacturing an elastic wave device includes forming a lower resist layer on the piezoelectric substrate; forming an upper resist layer on the lower resist layer; patterning the upper and lower resist layers with a developer with respect to which a solubility of the lower resist layer is higher than that of the upper resist layer to form a lower resist pattern and an upper resist pattern on the lower resist pattern so that a periphery of the lower resist pattern lies within a periphery of the upper resist pattern; depositing an electrode material over an entire surface of the piezoelectric substrate that has the upper resist pattern and the lower resist pattern formed thereon; and removing the upper resist pattern and the lower resist pattern to pattern the electrode material, thereby forming a comb-shaped electrode by lift-off.

6 Claims, 8 Drawing Sheets

U.S. PATENT DOCUMENTS

| | | | |
|---|---|---|---|
| 2006/0220494 A1* | 10/2006 | Miura et al. | 310/313 D |
| 2007/0090085 A1* | 4/2007 | Nakatani | 216/13 |
| 2008/0061657 A1* | 3/2008 | Matsuda et al. | 310/334 |
| 2009/0001592 A1* | 1/2009 | Barth et al. | 257/770 |

FOREIGN PATENT DOCUMENTS

| | | |
|---|---|---|
| JP | 2004-112748 A | 4/2004 |
| JP | 2006-279609 A | 10/2006 |
| JP | 2008-67289 A | 3/2008 |

* cited by examiner

METHOD FOR MANUFACTURING ELASTIC WAVE DEVICE

CROSS-REFERENCE TO RELATED APPLICATION

This application is based upon and claims the benefit of priority of the prior Japanese Patent Application No. 2008-207309, filed on Aug. 11, 2008, the entire contents of which are incorporated herein by reference.

FIELD

Aspects of the present invention relate to a method for manufacturing an elastic wave device.

BACKGROUND

As RF band filters and IF band filters for mobile communication equipment such as mobile phones and surface acoustic wave (SAW) filters are widely used. The SAW filter has a simple structure in which only comb-shaped electrodes are formed of aluminum or the like on a piezoelectric substrate, such as of lithium tantalate crystal, and has advantages such as a sharp cut-off characteristic, small size and weight, and low cost. However, along with the development of mobile communication equipment, the demands for the cut-off characteristic and the reduction in size and height become increasingly severe year after year. Therefore, it is difficult to realize such demands for SAW filters.

Elastic boundary wave devices, which utilize waves propagating along the boundary between different media, may provide a sharp cut-off characteristic because they have a small frequency-temperature coefficient. The elastic boundary wave device may be reduced in size and height because it requires no hermetic seal. The elastic boundary wave device is expected to become a substitute for the SAW filter and is under development.

Elastic boundary wave devices discussed in JP-A-2006-279609 and JP-A-2008-67289 have at least one dielectric layer stacked on comb-shaped electrodes formed on a piezoelectric substrate.

SUMMARY

According to an aspect of the embodiment, a method for manufacturing an elastic wave device includes: forming comb-shaped electrodes for exciting elastic waves on a piezoelectric substrate; forming a dielectric layer having a thickness greater than that of the comb-shaped electrode so as to cover the comb-shaped electrodes, forming an etch back layer so as to cover the dielectric layer, and etching an etch back layer and part of the dielectric layer under the conditions where the etch back layer and the dielectric layer are thinned at the same rate.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Figure 1A:
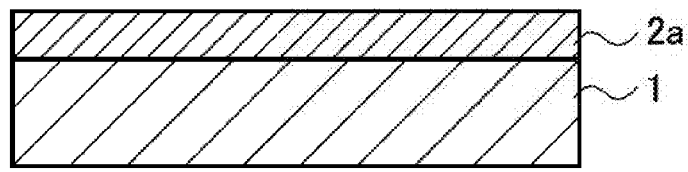
FIGS. 1A to 1F illustrate manufacturing steps of an elastic wave device.
Figure 1B:
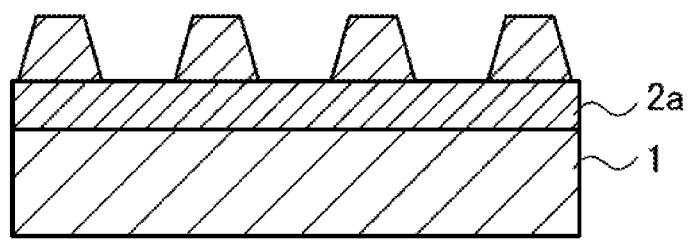
Figure 1C:
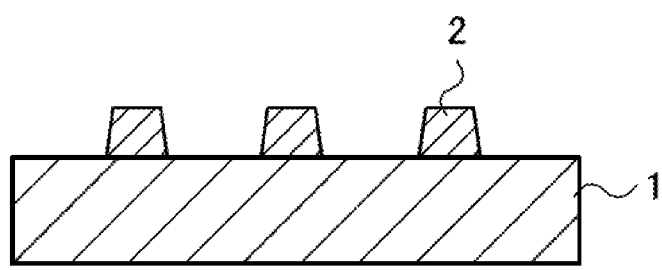

An aspect of the invention is a method for manufacturing an elastic wave device including comb-shaped electrodes formed on a piezoelectric substrate for exciting elastic waves and a dielectric layer disposed so as to cover the comb-shaped electrodes. The method for manufacturing the elastic wave device includes forming electrodes, forming a dielectric layer, forming an etch back layer, and etching or polishing. In forming electrodes, comb-shaped electrodes are formed on the piezoelectric substrate. In forming a dielectric layer, a dielectric layer having a thickness greater than that of the comb-shaped electrode is formed so as to cover the comb-shaped electrodes. In forming an etch back layer, an etch back layer is formed so as to cover the dielectric layer. In etching or polishing, the etch back layer and part of the dielectric layer are etched or polished. In etching or polishing, etching or polishing is performed under the conditions where the etch back layer and the dielectric layer are thinned at the same rate. In the step of etching or polishing, etching or polishing is performed until the etch back layer is completely removed.

According to the manufacturing method, after forming the comb-shaped electrodes, the dielectric layer having a thickness greater than that of the comb-shaped electrode is formed so as to cover the comb-shaped electrodes. Therefore, the manufacturing method does not create many voids between the comb-shaped electrodes and the dielectric layer. Further, the etch back layer and the dielectric layer are thinned at the same rate until the etch back layer is removed upon etching or polishing. Therefore, in the elastic wave device manufactured by the manufacturing method, the dielectric layer having its surface planarized remains. As a result, an elastic wave device with less propagation loss may be provided.

According to an aspect of the invention, an elastic wave device having no voids around comb-shaped electrodes and having a dielectric layer with planar surface is provided.

In an embodiment of an aspect of the invention, forming the comb-shaped electrodes includes forming a comb-shaped electrode pattern, forming a comb-shaped electrode material, and removing a resist. In forming a comb-shaped electrode pattern, a comb-shaped electrode pattern is formed of a resist having at least two layers on a piezoelectric substrate. The resist having at least two layers is formed such that the periphery of a lower layer of the two layers lies within the periphery of an upper layer.

The two-layer resist has a shape with undercuts formed therein. That is, the resist presents a shape which makes it difficult for an electrode material to attach to the resist and grow when the comb-shaped electrode material is formed next. Therefore, the creation of voids around the comb-shaped electrodes may be prevented.

In an embodiment of an aspect of the invention, forming the comb-shaped electrodes includes forming a sacrificial layer, forming a reversed pattern, etching the sacrificial layer, forming a comb-shaped electrode material, removing a resist, and removing the sacrificial layer.

In forming a sacrificial layer, a sacrificial layer is formed on a piezoelectric substrate. In forming a reversed pattern, the reversed pattern of the comb-shaped electrodes is formed of a resist on the sacrificial layer. In etching the sacrificial layer, the sacrificial layer is etched in the state where the resist is formed thereon.

In the manufacturing method, since the comb-shaped electrode material remains on the piezoelectric substrate after removing the sacrificial layer, and the dielectric layer is formed thereon, voids are not created between the dielectric layer and the comb-shaped electrodes.

In an embodiment of an aspect of the invention, the etch back layer may be formed by spin coating after the dielectric layer is vacuum-formed.

Thus, a dense dielectric layer is formed all over the comb-shaped electrodes by vacuum film forming process, and the surface of the etch back layer is planarized by spin coating. Therefore, after being thinned until the etch back layer is removed, the dielectric layer, which is dense and has a planar surface, remains. As a result, an elastic wave device having no voids around comb-shaped electrodes and having a dense dielectric layer with a planar surface may be provided. The vacuum film forming process may be performed by any film forming apparatus capable of densification. Examples of vacuum film forming process include chemical vapor deposition (CVD), sputtering, and vacuum deposition.

In an embodiment of an aspect of the invention, an aspect may be such that the etch back layer is formed of SOG, and that the etch back layer and the dielectric layer are etched under the conditions where their etching rates are the same in etching or polishing. Thus, the etch back layer and the dielectric layer are etched and thinned at the same rate.

In an embodiment of an aspect of the invention, the dielectric layer is made of $SiO_2$, and the etch back layer is made of SOG. The etch back layer and part of the dielectric layer are etched by reactive ion etching under the conditions where the flow rate ratio of $CF_4$ gas with respect to a mixed gas is 20% to 25% until the etch back layer is completely removed. Thus, the etch back layer and the dielectric layer may be thinned at the same rate.

FIGS. 1A to 1F illustrate manufacturing steps of an elastic wave device in an embodiment. First, an electrode layer 2a for forming comb-shaped electrodes 2 is deposited by sputtering on a piezoelectric substrate 1 as illustrated in FIG. 1A. The piezoelectric substrate 1 is made of, for example, lithium tantalate, lithium niobate, or the like. In forming the electrode layer 2a of the comb-shaped electrodes 2, for example, titanium may be first deposited to a thickness of 30 nm as an adhesion layer, and copper may be subsequently deposited by sputtering to a thickness of 100 nm. These are processed by photolithography and ion milling to form the comb-shaped electrodes 2 having a width of, for example, 0.5 μm (refer to FIGS. 1B and 1C).

Figure 1D:
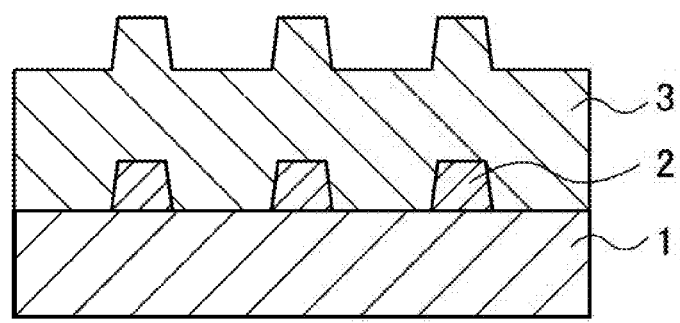
Figure 1E:
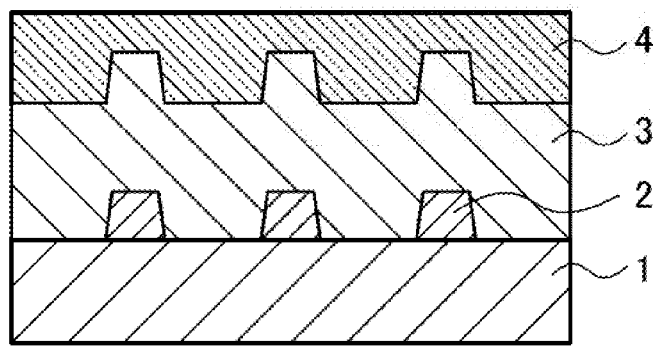

Next, $SiO_2$ is deposited by TEOS-CVD to a thickness of 1 μm as a dielectric layer 3 as illustrated in FIG. 1D. Further, spin on glass (SOG) is spin-coated to a thickness of 500 nm and baked at 400° C. as illustrated in FIG. 1E. The SOG film serves as an etch back layer 4. For sufficiently planarizing the surface of the etch back layer 4, the thickness of the SOG film (etch back layer 4) is preferably twice or more than that of the comb-shaped electrode 2.

Next, reactive ion etching (RIE) is performed on the entire surface of the substrate by using a mixed gas of $CF_4$ and $CHF_3$. In this case, RIE conditions are set such that etching rates of the SOG film (etch back layer 4) and the $SiO_2$ film (dielectric layer 3) deposited by TEOS-CVD are about the same. The RIE conditions include the flow rate ratio of $CF_4$ gas with respect to the mixed gas, for example. Hereinafter, the flow rate ratio will be described.

Figure 2:
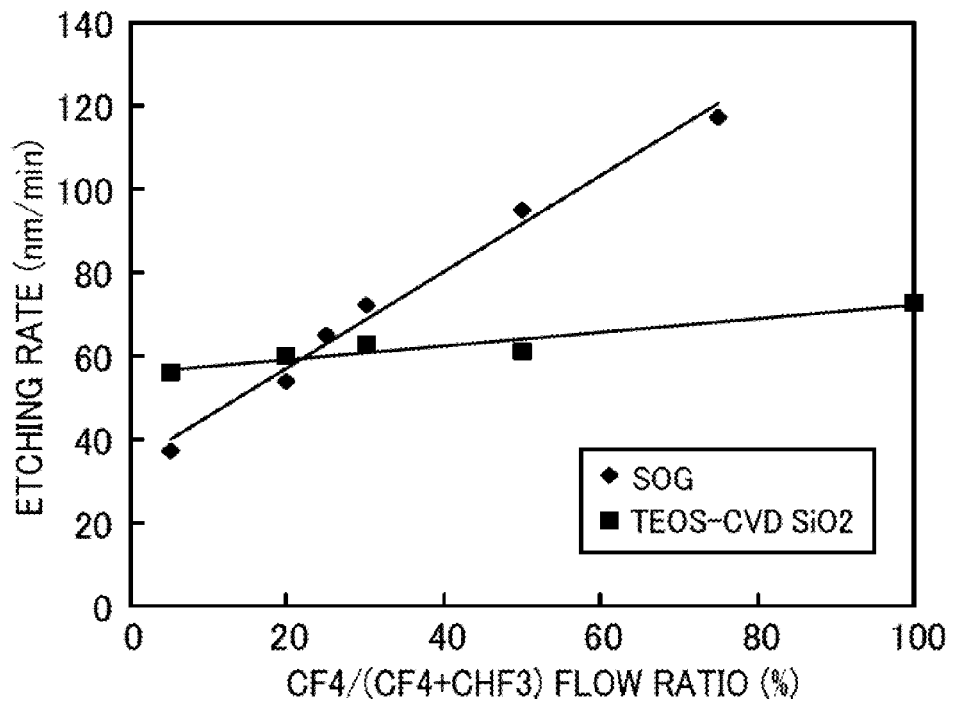
FIG. 2 is a graph illustrating relationships between the flow rate ratio and etching rate of an SOG film and a $SiO_2$ film.

FIG. 2 is a graph illustrating relationships between the flow rate ratio: $CF_4/(CF_4+CHF_3)$ and the etching rate of the SOG film and the $SiO_2$ film. As illustrated in FIG. 2, the etching rates of the SOG film and the $SiO_2$ film are substantially equal to each other when the flow rate ratio of $CF_4$ gas with respect to the mixed gas falls within a range from 10% to 34%. Particularly, when the flow rate ratio is 22%, the etching rates of the SOG film and the $SiO_2$ film are close to each other.

Figure 1F:
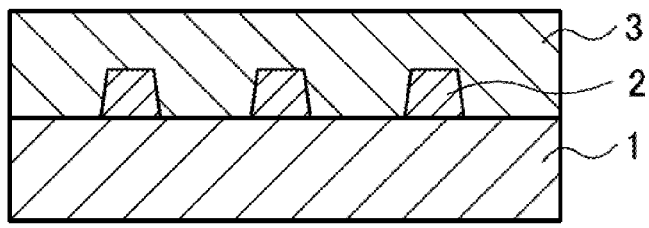

As an example, the flow rate of the mixed gas, the pressure, and the discharge power may be set to 200 sccm, 10 Pa, and 100 W, respectively. RIE is performed until the SOG film is completely removed, and then stopped after controlling the thickness of the $SiO_2$ film. The thickness of the $SiO_2$ film on the comb-shaped electrodes is, for example, 600 nm. As a result, a dielectric layer which is dense and has a planar surface remains on the comb-shaped electrodes as illustrated in FIG. 1F.

The RIE conditions which make the etching rates about the same is not limited to the example. In addition, the materials used for the etch back layer 4 and the dielectric layer 3 are not limited to the example (SOG film and $SiO_2$ film). A proper etching method and etching conditions may be set appropriately according to the etch back layer 4 and the dielectric layer 3.

As described above, in this embodiment as illustrated in FIGS. 1A to 1F, the comb-shaped electrodes 2 are first formed, and thereafter the dense dielectric layer 3 is deposited by CVD or the like. The dielectric layer 3 is deposited to a thickness slightly greater than a desired thickness. Next, SOG is coated as the etch back layer 4 and baked to planarize the surface thereof. Thereafter, the entire surface of the piezoelectric substrate 1 is etched (etch back) under such conditions that the etch back layer (SOG film) and the dielectric layer ($SiO_2$ film) have the same etching rate. At the time when SOG is completely etched, and further the dielectric layer is reduced in thickness to a desired thickness, the etching is stopped. Thus, trenches 45 (voids) illustrated in FIG. 6F are not created. The dense dielectric layer 3 is formed completely over the comb-shaped electrodes 2, and the surface of the dielectric layer 3 is planarized.

As another method, a method is also possible in which the comb-shaped electrodes 2 are first formed, thereafter SOG is coated and baked to planarize the surface thereof, and further the dielectric layer 3 is additionally deposited. In this method, however, SOG remains around the comb-shaped electrodes 2. The denseness of a SOG film is less than that of a CVD film, and as such may cause a worsening of the propagation loss of elastic waves. Therefore, it is preferable to form the dense dielectric layer 3 on the comb-shaped electrodes 2 like the steps illustrated in FIGS. 1A to 1F.

In the above embodiment, an example has been illustrated in which the etch back layer 4 and the dielectric layer 3 are etched under the conditions where they are thinned at the same rate. However, an apparatus for thinning may be not an etching apparatus as long as the layers may be thinned at the same rate. For example, the etch back layer 4 and the dielectric layer 3 may be thinned by a chemical mechanical polishing (CMP) or other polishing apparatus.

Figure 3A:
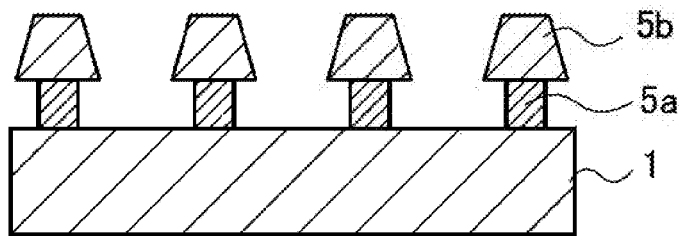
FIGS. 3A to 3F illustrate manufacturing steps of an elastic wave device.

FIGS. 3A to 3F illustrate manufacturing steps of an elastic wave device in another embodiment. As illustrated in FIG. 3A, a resist pattern obtained through the positive/negative reversal of the comb-shaped electrodes 2 is formed by using a two-layer resist for lift-off on the piezoelectric substrate 1. The two-layer resist includes a lower layer 5a formed on the piezoelectric substrate 1 and an upper layer 5b formed on the lower layer 5a. The two-layer resist has a shape with undercuts formed therein because the solubility of the lower layer 5a to a developer is higher than that of the upper layer 5b.

Figure 3B:
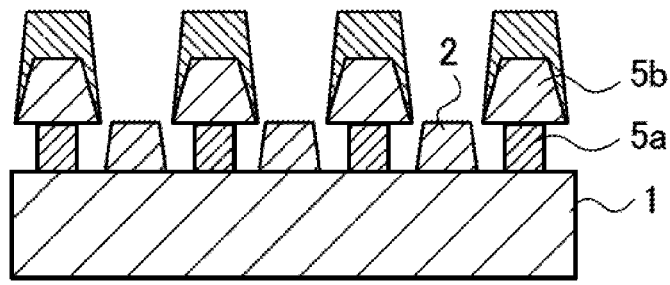
Figure 3C:
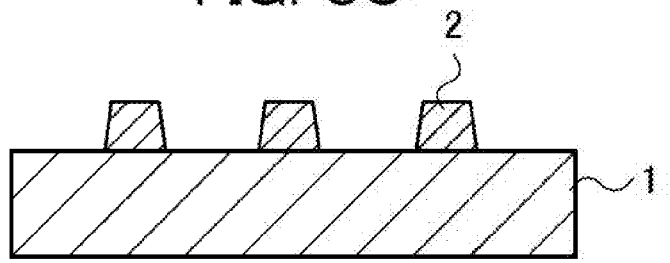
Figure 3D:
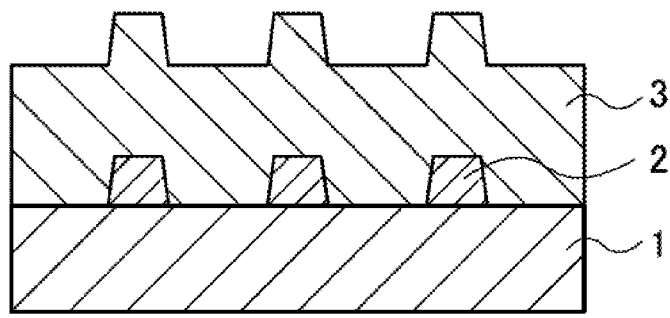
Figure 3E:
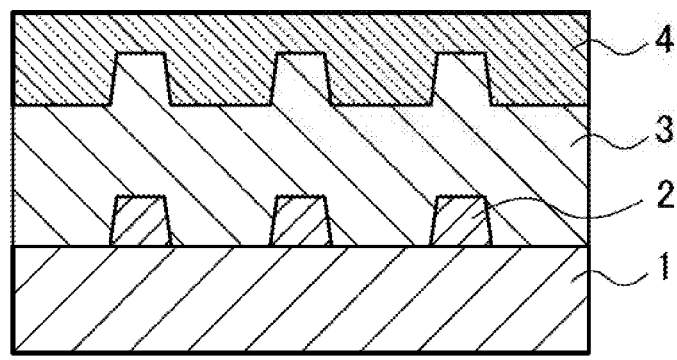
Figure 3F:
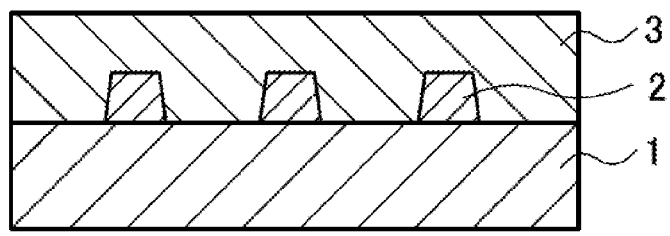

Next, an electrode material for forming the comb-shaped electrodes 2 is deposited by vapor deposition as illustrated in FIG. 3B. When the resist is removed with a solvent and lifted off, the comb-shaped electrodes 2 remain on the piezoelectric substrate 1 as illustrated in FIG. 3C. Subsequent steps illustrated in FIGS. 3D to 3F are the same as those in FIGS. 1D to 1F.

The above embodiment has described the case of using ion milling for patterning the comb-shaped electrodes 2. However, the propagation loss is worsened in some cases because the piezoelectric substrate 1 between the comb-shaped electrodes 2 is thinned by ion bombardment due to over-etching by ion milling. According to this embodiment, on the other hand, since the piezoelectric substrate 1 does not suffer from damage, a device with low loss may be provided.

Figure 4A:
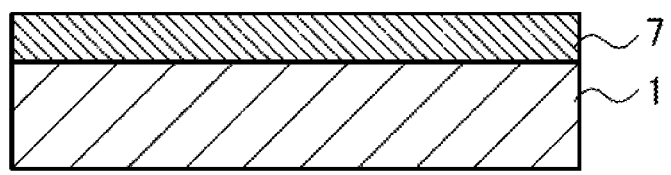
FIGS. 4A to 4I illustrate manufacturing steps of an elastic wave device.
Figure 4B:
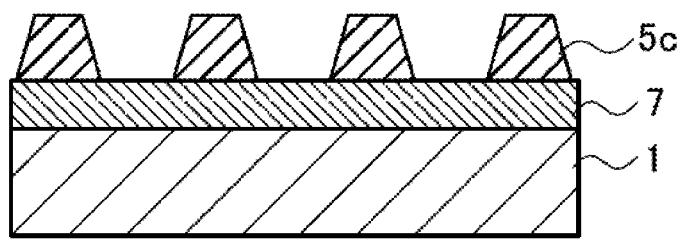

FIGS. 4A to 4I illustrate manufacturing steps of an elastic wave device in another embodiment. As illustrated in FIG. 4A, silicon is first deposited by sputtering to a thickness of 200 nm as a sacrificial layer 7 on the piezoelectric substrate 1. Next, a pattern of a resist 5c obtained through the positive/negative reversal of the comb-shaped electrodes 2 is formed as illustrated in FIG. 4B.

Figure 4C:
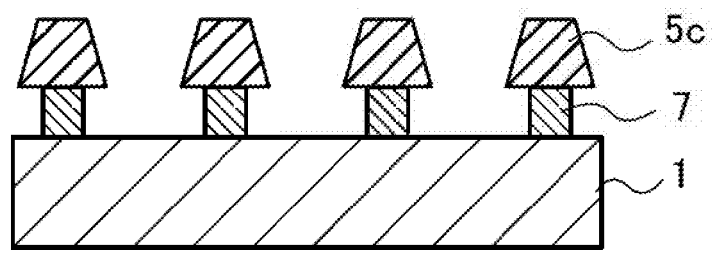
Figure 4D:
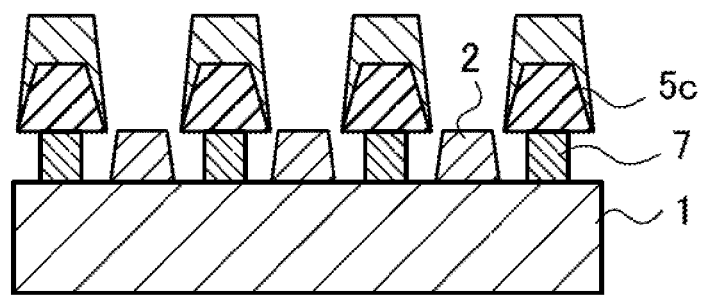

Next, RIE is performed on the silicon of the sacrificial layer 7 with $SF_6$ gas as illustrated in FIG. 4C. In this case, RIE conditions are set such that undercuts of about 100 nm are formed in silicon. As an example, the flow rate of $SF_6$ gas, the pressure, and the discharge power may be set to 150 sccm, 5 Pa, and 40 W, respectively.

Figure 4E:
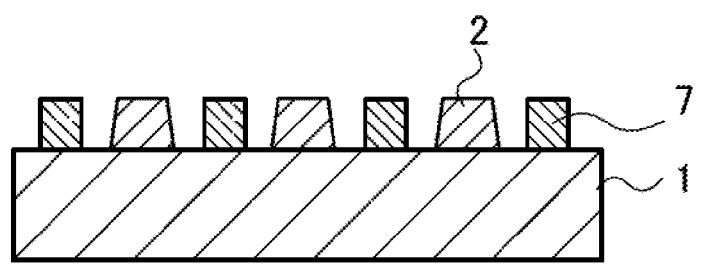
Figure 4F:
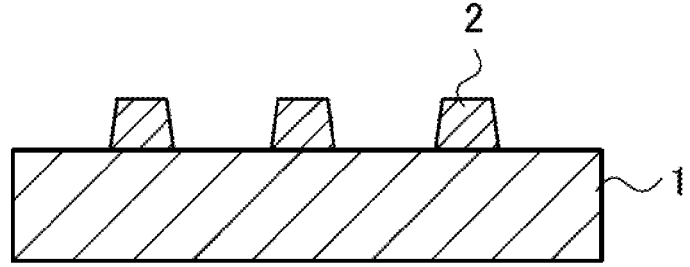
Figure 4G:
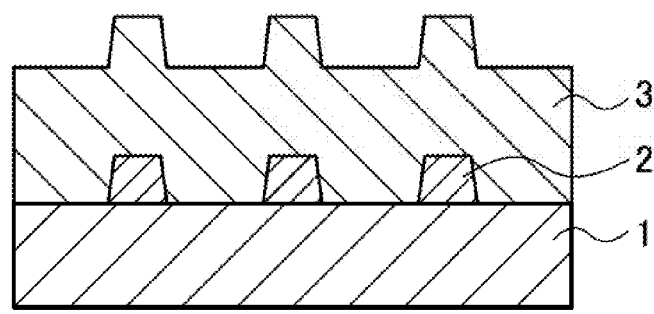
Figure 4H:
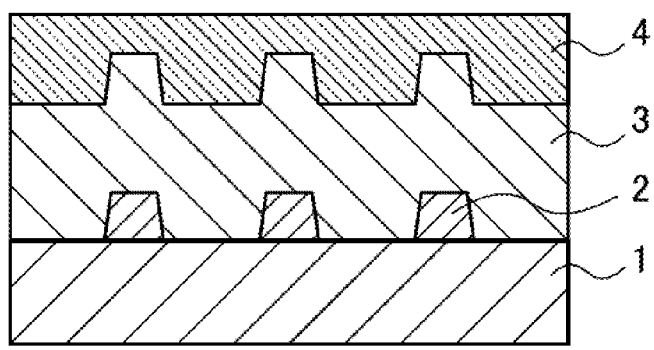
Figure 4I:
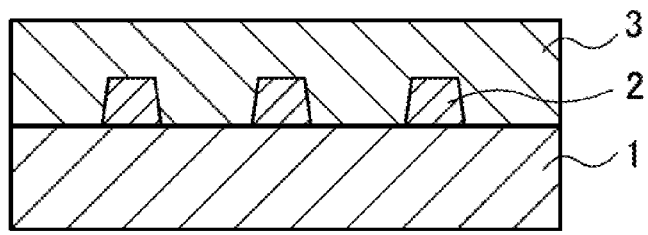

Next, an electrode material (copper, for example) of the comb-shaped electrodes 2 is vapor-deposited (FIG. 4D), and the resist 5c is removed with a solvent and lifted off (FIG. 4E). Further, RIE is performed under the same conditions as previously to remove the silicon of the sacrificial layer 7. As a result, the comb-shaped electrodes 2 are not etched but remain on the piezoelectric substrate 1 as illustrated in FIG. 4F. The material for the comb-shaped electrodes 2 may be, for example, copper. Subsequent steps illustrated in FIGS. 4G to 4I are the same as those in FIGS. 1D to 1F.

Since the baking temperature for the two-layer resist in the photolithography in the above embodiment is as high as about 180° C., the piezoelectric substrate 1 may crack in some cases. This embodiment does not include a high temperature step and has the tendency that the reproducibility of the shape of undercut and the in-plane uniformity are superior to those in the second embodiment. Further, since undercuts are formed in the silicon of the sacrificial layer 7, burr growth on the side wall of the comb-shaped electrode 2 illustrated in FIG. 7 does not occur. As a result, even when the dielectric layer 3 is coated on the comb-shaped electrodes 2, voids are not created around the comb-shaped electrodes 2.

Figure 5:
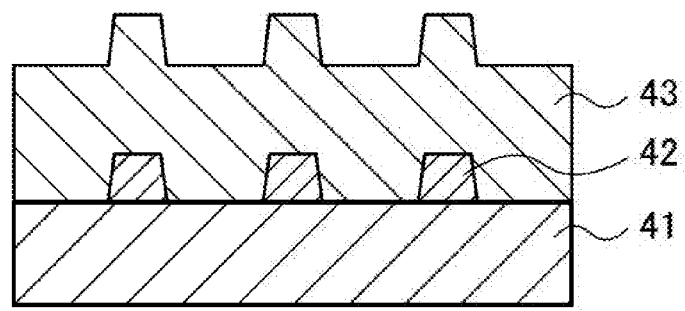
FIG. 5 is a cross sectional view of an elastic boundary wave device formed by a method of Comparative Example 1.

Comparative examples of the method for manufacturing the elastic boundary wave device will be described. As a manufacturing method of Comparative Example 1, a dielectric layer is stacked after forming comb-shaped electrodes as the simplest method. FIG. 5 is a cross sectional view of an elastic boundary wave device formed by the method of Comparative Example 1. In the elastic boundary wave device illustrated in FIG. 5, irregularities reflecting the shape of comb-shaped electrodes 42 are formed on the surface of a dielectric layer 43 formed so as to cover the comb-shaped electrodes 42 on a piezoelectric substrate 41. Such irregularities 42 weaken the confinement of elastic waves, impairing the degree of out-band suppression in filter characteristics. Accordingly, a manufacturing method, which may make the surface of a dielectric layer planar, is preferred.

Figure 6A:
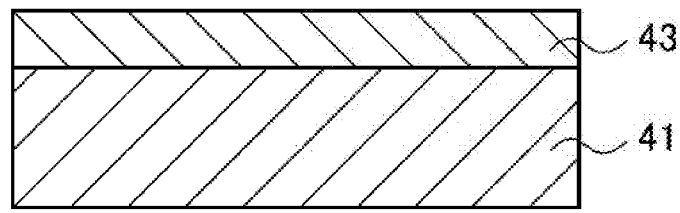
FIGS. 6A to 6F illustrate a manufacturing method of Comparative Example 2 for realizing the planarization of a dielectric layer.
Figure 6B:
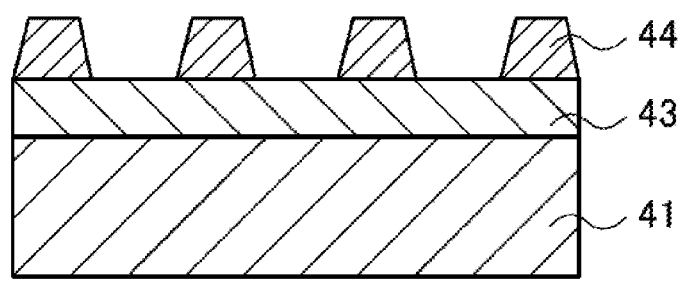
Figure 6C:
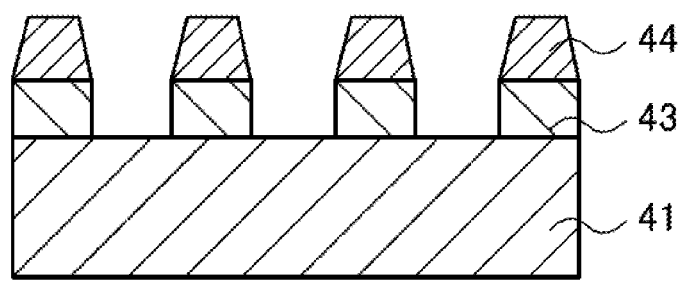
Figure 6D:
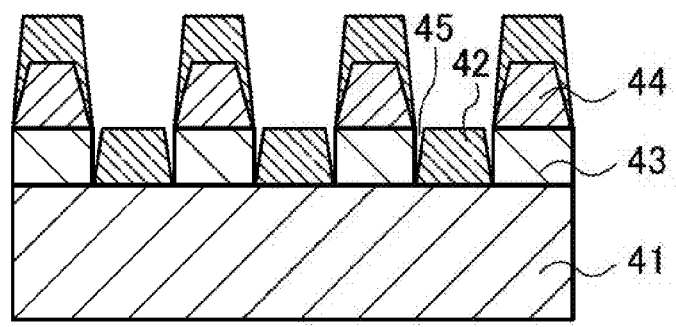
Figure 6E:
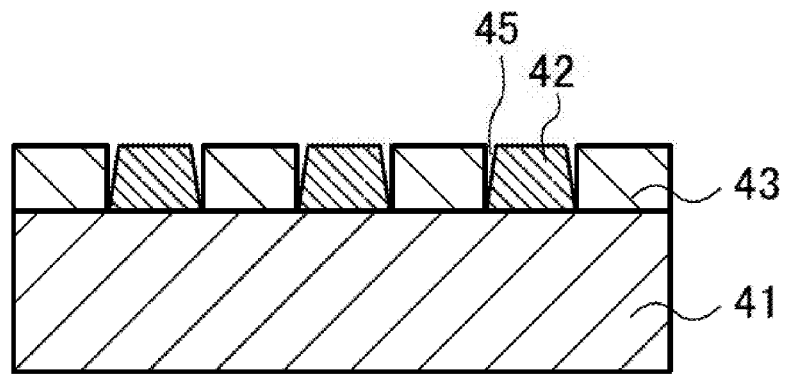
Figure 6F:
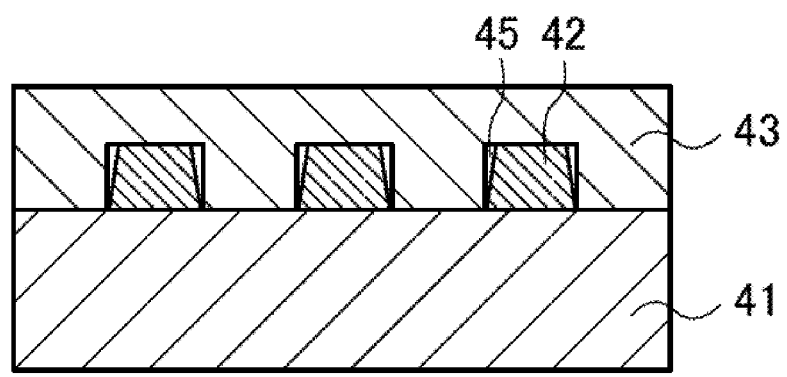

FIGS. 6A to 6F illustrate Comparative Example 2 of the method for manufacturing the elastic boundary wave device. Comparative Example 2 realizes the planarization of a dielectric layer. First, the dielectric layer 43 is deposited to the same thickness as that of the comb-shaped electrode 42 (FIG. 6A), and a positive/negative reversed pattern of the comb-shaped electrodes 42 is formed with a resist 44 (FIG. 6B). After the dielectric layer 43 is processed by RIE (FIG. 6C), the material of the comb-shaped electrodes 42 is vapor-deposited (FIG. 6D), and the resist 44 is dissolved and lifted off (FIG. 6E). Finally, the dielectric layer 43 is additionally deposited to a desired thickness (FIG. 6F).

Figure 7:
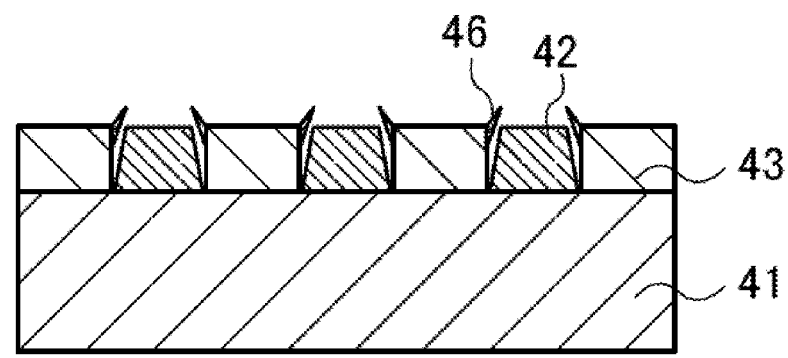
FIG. 7 illustrates an example of the case where an electrode material becomes attached to the side wall of a dielectric pattern 43.

In the vapor deposition step of the comb-shaped electrode material in FIG. 6D, since the electrode material is deposited while attaching the electrode material to the side wall of the resist 44, the comb-shaped electrode 42 is formed into a tapered shape. Accordingly, the trench 45 is created between the comb-shaped electrode 42 and the previously formed dielectric pattern 43. Further, as illustrated in FIG. 7, the electrode material also attaches to and grows on the side wall of the dielectric pattern 43 and remains as a burr 46 even after lift-off in some cases. When the dielectric layer is additionally deposited thereon, voids are created around the comb-shaped electrodes. The voids increase the propagation loss of elastic waves to cause a worsening of filter characteristics or the like.

Like the aspects of the invention, in order to provide an elastic boundary wave filter with low loss and high degree of suppression, it is preferable that no voids be present around the comb-shaped electrodes, and that a dielectric layer be dense and have a planar surface.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention has been described in detail, it should be understood that the various changes, substitutions, and alterations could be made hereto without departing from the spirit and scope of the invention.

The invention claimed is:

1. A method for manufacturing an elastic wave device, comprising:
   forming comb-shaped electrodes for exciting elastic waves on a piezoelectric substrate;
   forming a dielectric layer having a thickness greater than that of the comb-shaped electrodes so as to cover the comb-shaped electrodes,
   forming an etch back layer so as to cover the dielectric layer, and
   etching an etch back layer and part of the dielectric layer under the conditions where the etch back layer and the dielectric layer are thinned at the same rate,
   wherein forming the comb-shaped electrodes includes:
       forming a lower resist layer on the piezoelectric substrate;
       forming an upper resist layer on the lower resist layer;

patterning the upper and lower resist layers with a developer with respect to which a solubility of the lower resist layer is higher than that of the upper resist layer to form a lower resist pattern and an upper resist pattern on the lower resist pattern so that a periphery of the lower resist pattern lies within a periphery of the upper resist pattern;

depositing an electrode material over an entire surface of the piezoelectric substrate that has the upper resist pattern and the lower resist pattern formed thereon; and removing the upper resist pattern and the lower resist pattern to pattern the electrode material, thereby forming the comb-shaped electrode by lift-off.

2. The method according to claim 1, wherein the forming the comb-shaped electrodes includes forming a sacrificial layer on the piezoelectric substrate, forming a reversed pattern of the comb-shaped electrodes with a resist on the sacrificial layer, etching the sacrificial layer in a state where the resist is formed thereon, forming a comb-shaped electrode material, removing the resist, and removing the sacrificial layer.

3. The method according to claim 1, wherein the etch back layer is formed of SOG, and wherein the etch back layer and the dielectric layer are etched under the conditions where the etching rates are the same in the etching.

4. The method according to claim 1, wherein the dielectric layer is made of $SiO_2$, and the etch back layer is made of SOG, and wherein the etch back layer and part of the dielectric layer are etched by reactive ion etching under the conditions where a flow rate ratio of $CF_4$ gas with respect to a mixed gas is 20% to 25% until the etch back layer is completely removed.

5. The method according to claim 1, wherein the dielectric layer is made of $SiO_2$, and the etch back layer is made of SOG, and wherein the etch back layer and part of the dielectric layer are etched by reactive ion etching until the etch back layer is completely removed under the conditions where a flow rate ratio of $CF_4$ gas with respect to a mixed gas is 20% to 25%.

6. The method according to claim 5, wherein $SiO_2$ of the dielectric layer is deposited by TEOS-CVD, and SOG of the etch-back layer is spin-coated, and wherein the etch back layer and the part of the dielectric layer are etched by reactive ion etching until the etch back layer is completely removed under the conditions where a flow rate ratio of $CF_4$ gas with respect to a mixed gas of $CF_4$ and $CHF_3$ is 20% to 25%.

\* \* \* \* \*